United States Patent
David et al.

(10) Patent No.: US 7,977,694 B2
(45) Date of Patent: Jul. 12, 2011

(54) HIGH LIGHT EXTRACTION EFFICIENCY LIGHT EMITTING DIODE (LED) WITH EMITTERS WITHIN STRUCTURED MATERIALS

(75) Inventors: Aurelien J. F. David, Paris (FR); Claude C. A. Weisbuch, Paris (FR); Steven P. DenBaars, Goleta, CA (US); Stacia Keller, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 574 days.

(21) Appl. No.: 11/940,866

(22) Filed: Nov. 15, 2007

(65) Prior Publication Data
US 2008/0135864 A1 Jun. 12, 2008

Related U.S. Application Data

(60) Provisional application No. 60/866,015, filed on Nov. 15, 2006.

(51) Int. Cl.
*H01L 27/15* (2006.01)
*H01L 29/26* (2006.01)

(52) U.S. Cl. ............ 257/98; 257/79; 257/E21.001; 257/E33.068

(58) Field of Classification Search .......... 257/98, 257/79, E21.001, E33.068
See application file for complete search history.

(56) References Cited

U.S. PATENT DOCUMENTS

| | | |
|---|---|---|
| 5,226,053 A | 7/1993 | Cho et al. |
| 5,362,977 A | 11/1994 | Hunt et al. |
| 5,594,749 A * | 1/1997 | Behfar-Rad et al. ....... 372/45.01 |
| 5,779,924 A | 7/1998 | Krames et al. |
| 6,163,038 A | 12/2000 | Chen et al. |
| 6,504,180 B1 | 1/2003 | Heremans et al. |
| 6,525,464 B1 | 2/2003 | Chin |
| 6,538,371 B1 | 3/2003 | Duggal et al. |
| 6,670,647 B1 | 12/2003 | Yamasaki et al. |
| 6,812,053 B1 | 11/2004 | Kong et al. |
| 7,279,718 B2 | 10/2007 | Krames et al. |
| 2002/0021479 A1 | 2/2002 | Scalora et al. |
| 2003/0141507 A1 | 7/2003 | Krames et al. |
| 2003/0234404 A1* | 12/2003 | Matsuoka et al. ........... 257/103 |
| 2005/0040424 A1 | 2/2005 | Erchak et al. |
| 2005/0242364 A1 | 11/2005 | Moustakas et al. |
| 2007/0018184 A1* | 1/2007 | Beeson et al. .................. 257/98 |

OTHER PUBLICATIONS

International Search Report mailed Jun. 5, 2008, International application No. PCT/US07/24016.

(Continued)

*Primary Examiner* — Cuong Q Nguyen
*Assistant Examiner* — Cathy N Lam
(74) *Attorney, Agent, or Firm* — Gates & Cooper LLP

(57) ABSTRACT

Light Emitting Diodes (LEDs) where the emission region, usually a (Al,In,Ga)N layer, is structured for efficient light extraction, are disclosed. The structuring is designed for light extraction from thin films, such as a photonic crystal acting as a diffraction grating. In addition, the structuring controls the in-plane emission and allows new modes into which light will be emitted. Various electrode designs are proposed, including ZnO structures which are known to lead to both excellent electrical properties, such as good carrier injection, and high transparency. Alternatively, the (Al,In,Ga)N layer can be replaced by structures with other materials compositions, in order to achieve efficient light extraction.

26 Claims, 11 Drawing Sheets

OTHER PUBLICATIONS

Krames et al., "High-power truncated-inverted-pyramid (AlxGa1-xIn0.5P/GaP light-emitting diodes exhibiting greater than 50% external quantum efficiency," Applied Physics Letters, vol. 75, pp. 2365-2367 (1999).

Schmid et al., "45% quantum efficiency light-emitting-diodes with radial outcoupling taper," presented at SPIE, San Jose, California (2000).

Schnitzer et al., "30% external quantum efficiency from surface textured, thin-film light-emitting-diodes," Applied Physics Letters, vol. 63, pp. 2174-2176 (1993).

Fuji et al., "Cone-shaped surface GaN-based light-emitting diodes," Physica Status Solidi C, No. 7, pp. 2836-2840 (2005).

Feng et al., "Enhanced luminescence from GaN-based blue LEDs grown on grooved sapphire substrates," IEEE Photonics Technology Letters, vol. 17, No. 9, pp. 1812-1814 (Sep. 2005).

Gessmann et al., "Light-emitting diodes with integrated omnidirectionally reflective contacts," Proceedings of the SPIE, vol. 5366, No. 1, pp. 53-61 (2004).

Windisch et al., "InGaAlP thin film LEDs with high luminous efficiency," Proceedings of the SPIE, vol. 5366, No. 1, pp. 43-52 (2004).

Shen et al., "Optical cavity effects in InGaN/GaN quantum-well-heterostructure flip-chip light-emitting diodes," Proceedings of the SPIE, vol. 5366, No. 1, pp. 20-25 (2004).

Joray et al., "High efficiency planar MCLEDs," Physica Status Solidi B, vol. 242, pp. 2315-2325, (2005).

Weisbuch et al, "Recent results and latest views on microcavity LEDs," Proceedings of the SPIE, vol. 5366, No. 1, pp. 1-19 (2004).

David et al., "Photonic crystal laser lift-off GaN light-emitting diodes," Applied Physics Letters, vol. 88, pp. 133514-1-3 (2006).

Davis et al., "Pendeo-epitaxy—a new approach for lateral growth of gallium nitride films," MRS Internet Journal Nitride Research 6, p. 14, (2001).

Katona et al., "Effect of the nucleation layer on stress during cantilever epitaxy of GaN on Si (111)," Physical Status Solidi A, 194, pp. 541-544, (2002).

Kidoguchi et al., "Air-bridged lateral epitaxial overgrowth of GaN thin films," Applied Physics Letters 76, pp. 3768-3770 (2000).

Beaumont et al., "Epitaxial Lateral Overgrowth of GaN," Physica Status Solidi (b) 227, pp. 1-43 (2001).

Fujita et al., "Simultaneous Inhibition and Redistribution of Spontaneous Light Emission in Photonic Crystals," Science vol. 308, p. 1296, (2005).

Keller et al., "Optical and structural properties of GaN nanopillar and nanostripe arrays with embedded InGaN/GaN multi quantum wells," Journal of Applied Physics 100, 054314 (2006).

* cited by examiner

HIGH LIGHT EXTRACTION EFFICIENCY LIGHT EMITTING DIODE (LED) WITH EMITTERS WITHIN STRUCTURED MATERIALS

CROSS-REFERENCE TO RELATED APPLICATIONS

This application claims the benefit under 35 U.S.C. Section 119(e) of the following co-pending and commonly-assigned U.S. patent applications:

U.S. Provisional Application Ser. No. 60/866,015, filed on Nov. 15, 2006, by Aurelien J. F. David, Claude C. A. Weisbuch, Steven P. DenBaars and Stacia Keller, entitled "HIGH LIGHT EXTRACTION EFFICIENCY LIGHT EMITTING DIODE (LED) WITH EMITTERS WITHIN STRUCTURED MATERIALS,";

which application is incorporated by reference herein.

This application is related to the following co-pending and commonly-assigned applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING," now U.S. Pat. No. 7,704,763, issued Apr. 27, 2010, which application claims the benefit under 35 U.S.C. Section 365(c) of PCT Application Serial No. US2003/03921 filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,";

U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE,";

U.S. Utility application Ser. No. 10/938,704, filed on Sep. 10, 2004, by Carole Schwach, Claude C. A. Weisbuch, Steven P. DenBaars, Henri Benisty and Shuji Nakamura, entitled "WHITE, SINGLE OR MULTICOLOR LED BY RECYCLING GUIDED MODES," now U.S. Pat. No. 7,223,998, issued May 29, 2007;

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS," now U.S. Pat. No. 7,344,958, issued Mar. 18, 2008, which application claims the benefit under 35 U.S.C. Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS,";

U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERTICAL EMITTING, BEAM SHAPED, DISTRIBUTED FEEDBACK (DFB) LASERS BY GROWTH OVER A PATTERNED SUBSTRATE," now U.S. Pat. No. 7,345,298, issued Mar. 18, 2008;

U.S. Utility application Ser. No. 11/067,910, filed Feb. 28, 2005, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE," now U.S. Pat. No. 7,291,864 issued Nov. 6, 2007;

U.S. Utility application Ser. No. 11/067,956, filed Feb. 28, 2005, by Aurelien J. F. David, Claude C. A Weisbuch and Steven P. DenBaars, entitled "HIGH EFFICIENCY LIGHT EMITTING DIODE (LED) WITH OPTIMIZED PHOTONIC CRYSTAL EXTRACTOR," now U.S. Pat. No. 7,582,910, issued Sep. 1, 2009;

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL, IN, GA)N WAFERS," which application claims the benefit under 35 U.S.C Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,";

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS," now U.S. Pat. No. 7,795,146, issued Sep. 14, 2010, which application claims the benefit under 35 U.S.C. Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD," now U.S. Pat. No. 7,719,020, issued May 18, 2010, which application claims the benefit under 35 U.S.C. Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD," U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD," and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES," now U.S. Pat. No. 7,768,023, issued Aug. 3, 2010;

U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH," now U.S. Pat. No. 7,768,024, issued Aug. 3, 2010, which application claims the benefit under 35 U.S.C. Section 119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,";

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED)," which application claims the benefit under 35 U.S.C Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Utility application Ser. No. 11/608,439, filed on Dec. 8, 2006, by Steven P. DenBaars, Shuji Nakamura and James S. Speck, entitled "HIGH EFFICIENCY LIGHT EMITTING DIODE (LED)," which application claims the benefit under 35 U.S.C Section 119(e) of U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED)," and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

U.S. Utility application Ser. No. 11/676,999, filed on Feb. 20, 2007, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B)N OPTOELECTRONIC DEVICES," which application claims the benefit under 35 U.S.C Section 119(e) of U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B)N OPTOELECTRONIC DEVICES,";

U.S. Utility patent application Ser. No. 11/940,848, filed on Nov. 15, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," which application claims the benefit under 35 U.S.C. Section 119(e) of U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," and U.S. Provisional Patent Application Ser. No. 60/883,977, filed on Jan. 8, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,";

U.S. utility patent application Ser. No. 11/940,853, filed on Nov. 15, 2007, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES," which application claims the benefit under 35 U.S.C. Section 119(e) of U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES,";

U.S. Utility patent application Ser. No. 11/940,876, filed on Nov. 15, 2007, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING," which application claims the benefit under 35 U.S.C. Section 119(e) U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,";

U.S. Utility patent application Ser. No. 11/940,885, filed on Nov. 15, 2007, by Natalie N. Fellows, Steven P. DenBaars and Shuji Nakamura, entitled "TEXTURED PHOSPHOR CONVERSION LAYER LIGHT EMITTING DIODE," which application claims the benefit under 35 U.S.C. Section 119(e) of U.S. Provisional Patent Application Ser. No. 60/866,024, filed on Nov. 15, 2006, by Natalie N. Fellows, Steven P. DenBaars and Shuji Nakamura, entitled "TEXTURED PHOSPHOR CONVERSION LAYER LIGHT EMITTING DIODE,";

U.S. Utility patent application Ser. No. 11/940,872, filed on Nov. 15, 2007, by Steven P. DenBaars, Shuji Nakamura and Hisashi Masui, entitled "HIGH LIGHT EXTRACTION EFFICIENCY SPHERE LED," which application claims the benefit under 35 U.S.C. Section 119(e) of U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED,";

U.S. Utility patent application Ser. No. 11/940,883, filed on Nov. 15, 2007, by Shuji Nakamura and Steven P. DenBaars, entitled "STANDING TRANSPARENT MIRROR-LESS (STML) LIGHT EMITTING DIODE," now U.S. Pat. No. 7,687,813, issued Mar. 30, 2010, which application claims the benefit under 35 U.S.C. Section 119(e) of U.S. Provisional Patent Application Ser. No. 60/866,017, filed on Nov. 15, 2006, by Shuji Nakamura and Steven P. DenBaars, entitled "STANDING TRANSPARENT MIRROR-LESS (STML) LIGHT EMITTING DIODE,"; and U.S. Utility patent application Ser. No. 11/940,898, filed on Nov. 15, 2007, by Steven P. DenBaars, Shuji Nakamura and James S. Speck, entitled "TRANSPARENT MIRROR-LESS (TML) LIGHT EMITTING DIODE," now U.S. Pat. No. 7,781,789, issued Aug. 24, 2010, which application claims the benefit under 35 U.S.C. Section 119(e) of U.S. Provisional Patent Application Ser. No. 60/866,023, filed on Nov. 15, 2006, by Steven P. DenBaars, Shuji Nakamura and James S. Speck, entitled "TRANSPARENT MIRROR-LESS (TML) LIGHT EMITTING DIODE,";

all of which applications are incorporated by reference herein.

BACKGROUND OF THE INVENTION

1. Field of the Invention

The present invention is related to light emitting diode (LED) light extraction for opto-electronic applications. More precisely, the invention relates to the use of a structured emitting region suited for extraction of light usually trapped in the (Al,In,Ga)N thin film.

2. Description of the Related Art (Note: This application references a number of different publications and patents as indicated throughout the specification by one or more reference numbers within brackets, e.g., [Ref. x]. A list of these different publications and patents ordered according to these reference numbers can be found below in the section entitled "References." Each of these publications and patents is incorporated by reference herein.)

A number of publications and patents are devoted to the issue of light extraction from light-emitting semiconductor material. Light extraction can be achieved using geometrical optics effects, for example, using pyramids, outcoupling tapers or textured surfaces [8-14], or wave optics effects, for example, using microcavity resonances or photonic crystal extraction [15-18]. Special growth techniques such as pendeo or cantilever growths [19,20] or lateral epitaxial overgrowth [21,22] may also be used to achieve light extraction.

For more recent advances in the field of LED extraction, little is published. However, the concepts for light extraction using photonic crystal effects or Zinc Oxide (ZnO) pyramids are well-described in the applications listed in the Cross-Reference section above.

An efficient method for enhancing light extraction from an (Al,In,Ga)N LED consists in using photonic crystals to extract the light. Some proposals rely on the control of optical modes using a membrane system where most horizontal in-plane modes are suppressed by the photonic crystals, and the oblique modes do not radiate out of the membrane due to total internal reflection [23]. However, such structures suffer from two drawbacks: (1) the radiative emission rate is highly suppressed, requiring (2) emitting species with very high radiative efficiency, a property not easily achievable at room temperature.

Other implementations rely on using photonic crystals as a diffractive grating, positioned outside the emitting layer, as described in U.S. Provisional Application Ser. Nos. 60/866,014; 60/802,993; and 60/741,935; and U.S. Utility application Ser. Nos. 11/067,957; 11/067,910; and 11/067,956; which applications are listed in the Cross-Reference section above.

However, in such implementations, the interaction between the structure's guided modes and the crystal is rather weak, requiring a rather long photonic crystal, and consequently a large device, in order to extract most of the guided light. It is therefore highly desirable to incorporate the photonic crystal within the emitting layer, in order to achieve maximum interaction. However, this leads to three problems.

First, possible diminished radiative efficiency due to the large free surface of the active region which is degraded when etching the photonic crystal structure. Nonetheless, high quality material can still be obtained, by using annealing steps following the etching, as described in [24]. Alternatively, high quality material can also be obtained by direct columnar growth of the structure.

Another problem results from the lower photonic density of states in the etched region, which is a natural consequence of the diminished average index of refraction.

Finally, another source of very diminished emission might be due to the emitting layer having a lower index than the surrounding layer, and thus not supporting guided or localized modes.

SUMMARY OF THE INVENTION

The present invention discloses a structured light emitting region within the LED including one or more active layers intermixed or embedded within a plurality of index modulation layers, wherein the index modulation layers are structured as a photonic crystal. The LED also includes a p-type contact on the LED and an n-type contact on the LED, wherein a bias is applied across the contacts. The index modulation layers include a lower index layer and a higher index layer, and the active layer is positioned inside the lower index layer. The LED has an emission rate 60% to 80% of an emission rate for a non structured emitting region comprised of the higher index layer.

The p or n type contact may be a transparent electrode or a reflective contact. The transparent electrode may comprise zinc oxide, silicon carbide or indium tin oxide. The structured emitting region may comprise (Al,Ga,In)N.

The LED may further comprise a backside mirror positioned on the top or bottom surface of the LED. The LED may further comprise an intermediate GaN layer on top of the structured emitting region and/or a lateral epitaxial grown region on top of the structured emitting region.

The LED may also comprise materials filling holes in the photonic crystal, wherein the material filling the holes is dielectric, metal, semiconductor, or optically active such as light emitting polymers or dyes. The photonic crystal may have a regular or a non-regular pattern, or a pattern optimised for directional light emission.

The present invention also discloses a method for fabricating a light emitting diode having efficient light extraction, comprising forming a structured emitting region including one or more active layers embedded in a plurality of index modulation layers, wherein the index modulation layers are structured as a photonic crystal; and forming both a p-type contact and an n-type contact on the LED for applying a bias across the contacts.

The method may further comprise forming a reflective contact on top of the structured light emitting layers. Alternatively, the method may comprise forming a transparent contact by direct deposition or attachment of a thin conductive and transparent layer on top of the structured light emitting layers.

The method may further comprise removing the structured light emitting layers from a substrate and/or thinning the structured light emitting layers. The method may further comprise growing or regrowing GaN on top of the structured light emitting layers.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Technical Description

For conciseness throughout this disclosure, "(Al,Ga,In)N layer" will refer to an ensemble of layers deposited or grown by any technique, for example, by MBE (molecular beam epitaxy), MOCVD (metalorganic chemical vapour deposition) or VPE (vapour phase epitaxy), and usually comprising: a buffer layer grown on a substrate, one or more active layers such as quantum wells, quantum dots, barriers, or any other light emitting semiconductor layer, current blocking layers, contact layers, and other layers typically grown for a LED (light emitting diode) and well known in the state of the art. It is also well known in the art that these layers may be adapted for various specific implementations, in particular they may be adapted for each desired wavelength range being emitted by the LED.

The present invention discloses designs for structures which retain a high emission rate as well as high internal efficiency and extraction. Typically, the emission rate can be 60-80% of the value for a non-structured high index material.

Figure 1A:
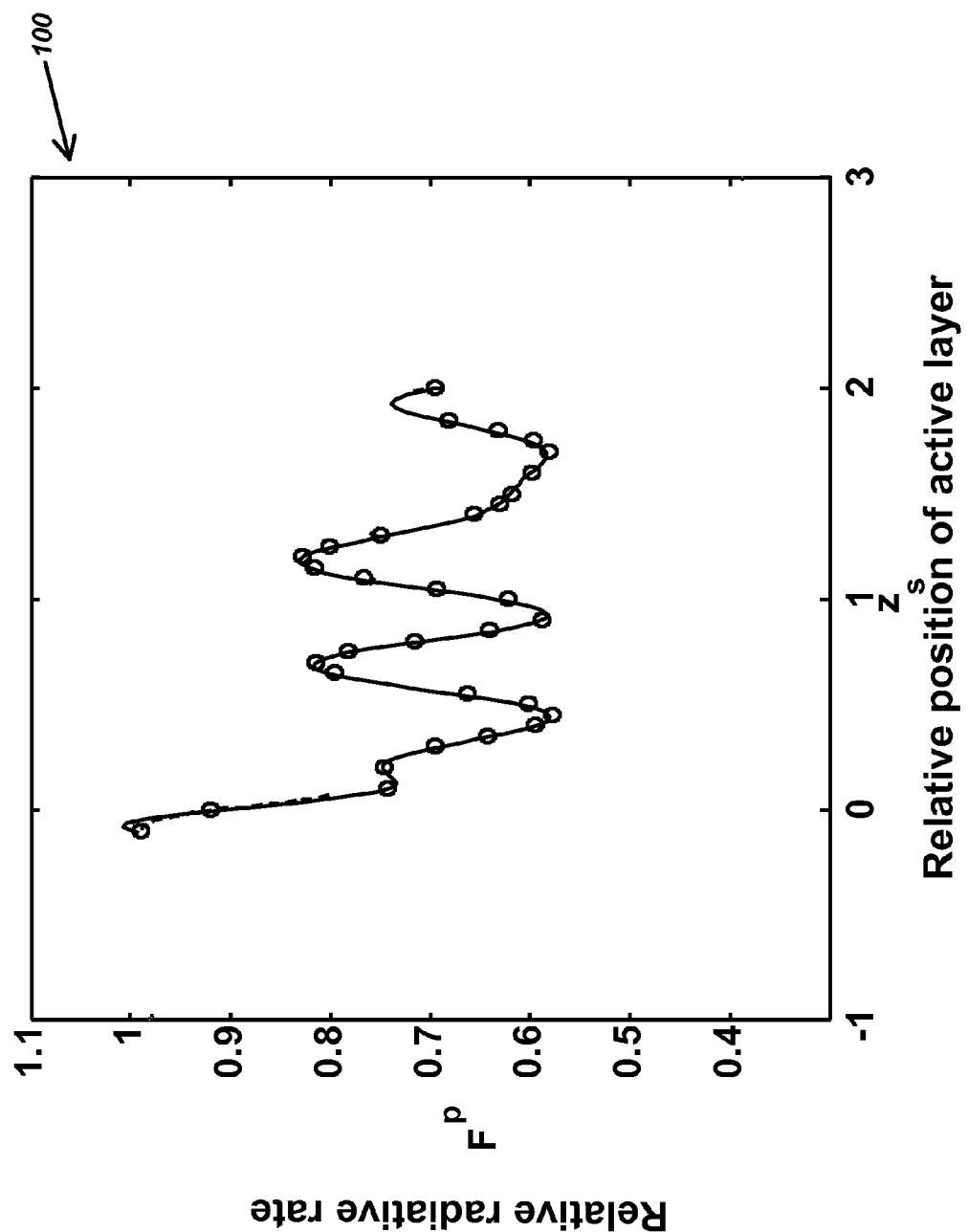
FIG. 1A is a graph of relative radiative rate as a function of relative active (light emitting) layer position within a low index layer, wherein the relative radiative rate is the radiative rate divided by the radiative rate for a reference high index sample.

FIG. 1A is a graph 100 of relative radiative rate as a function of relative active (light emitting) layer position within a low index layer, wherein the relative radiative rate is the radiative rate divided by the radiative rate for a reference high index sample.

Figure 1B:
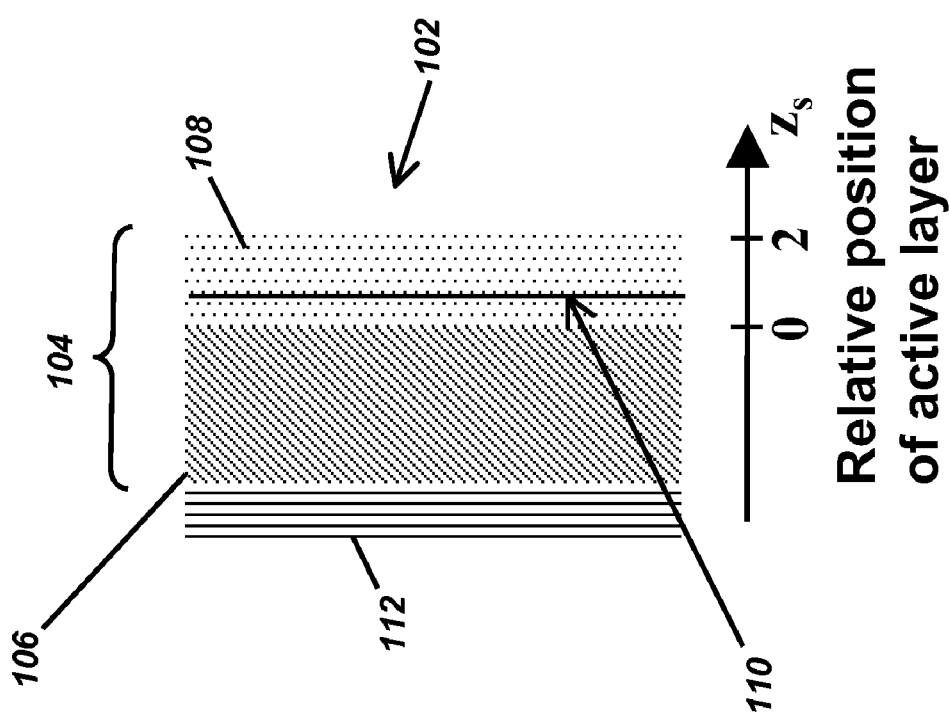
FIG. 1B is a schematic of a standard (Al,In,Ga)N LED illustrating a relative position of an active layer within an (Al,In,Ga)N layer as reflected in FIG. 1A.

FIG. 1B is a schematic of an (Al,In,Ga)N LED 102 having a (Al,In,Ga)N layer 104 containing a high index layer 106, a low index layer 108, and an active layer 110, wherein the a high index layer 106 and low index layer 108 are referred to as index modulation layers. LED 102 further contains growth buffer layer 112 (on top of a substrate, which is not shown).

The relative position of the active layer 110 within the (Al,In,Ga)N layer 104 is shown in FIGS. 1A and 1B as $Z_s$. Accordingly, FIGS. 1A and 1B shows the dipole emission 100, representing the light emitted by a quantum well placed at various positions in a structure 102 comprising two layers—a high refractive index layer 106 with n=2.5 and a low index layer 108 having a refractive index of n=1.9. As can be seen, for given positions of the emitting species 110, the emission rate is about 80% of the rate for dipoles placed in a high index medium 106.

Figure 2:
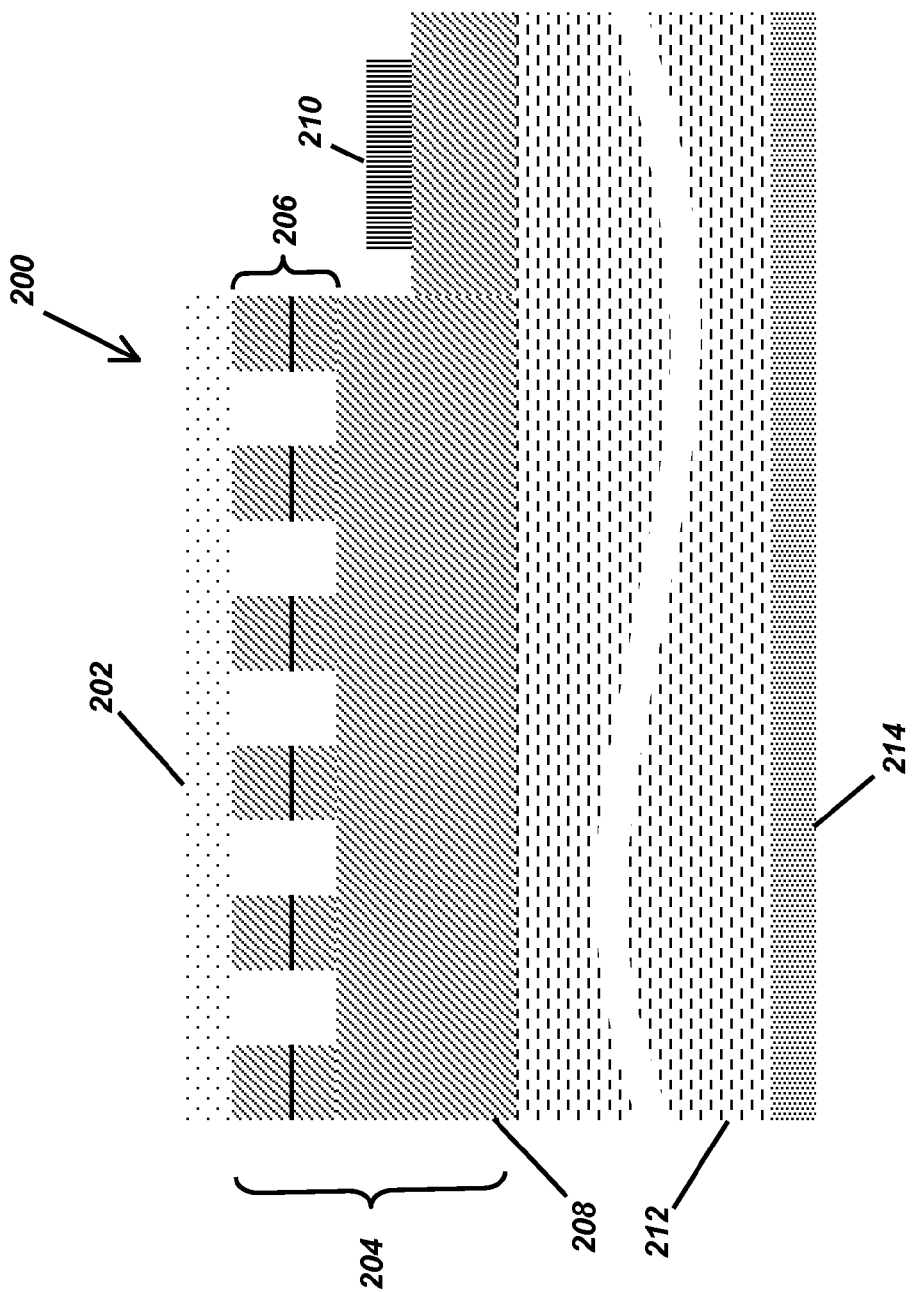
FIG. 2 is a schematic cross-section of an (Al, Ga, In)N LED structure comprising a top transparent electrode and a structured emitting region.

FIG. 2 is a schematic cross-section of an (Al, Ga, In)N LED structure 200 comprising a top transparent electrode 202, (Al,Ga,In)N layers 204, which includes a structured emitting region/active layer 206 and a buffer layer 208, an n contact 210, a substrate 212, and an optional backside mirror 214. Thus, FIG. 2 is a schematic of a typical structure 200 for the present invention, comprising a GaN based LED that has been grown with the (Al,Ga,In)N layers 204 comprising an ensemble of layers 206, 208 grown or deposited by any technique, for example, by MBE, MOCVD or VPE.

Preferably, the structured emitting region/active layer 206 includes one or more active layers embedded within a plurality of index modulation layers, wherein the index modulation layers are structured as a photonic crystal with an embedded active layer. Specifically, the index modulation layers comprise a lower index layer and a higher index layer, and the active layer is positioned inside the lower index layer. Moreover, the structured emitting region/active layer 206 may be structured by etching, according to the description found in [24]. Alternatively, the structured emitting region/active layer 206 may be structured by direct organized growth.

A transparent p contact layer 202 is placed on the structured emitting region/active layer 206, either by direct deposition, for example, pendeo or canteliver epitaxy, or by attachment of a thin material layer such as ZnO. Any type of bonding can be used as long as it leads to good electrical contact while preserving good optical properties. Since light is also emitted towards the substrate 212, it can prove advantageous to use a mirror 214 on the substrate 212 to reflect any light upwards that has been emitted downwards. Accordingly, light emission may be up or up and down in accordance with the invention.

Figure 3:
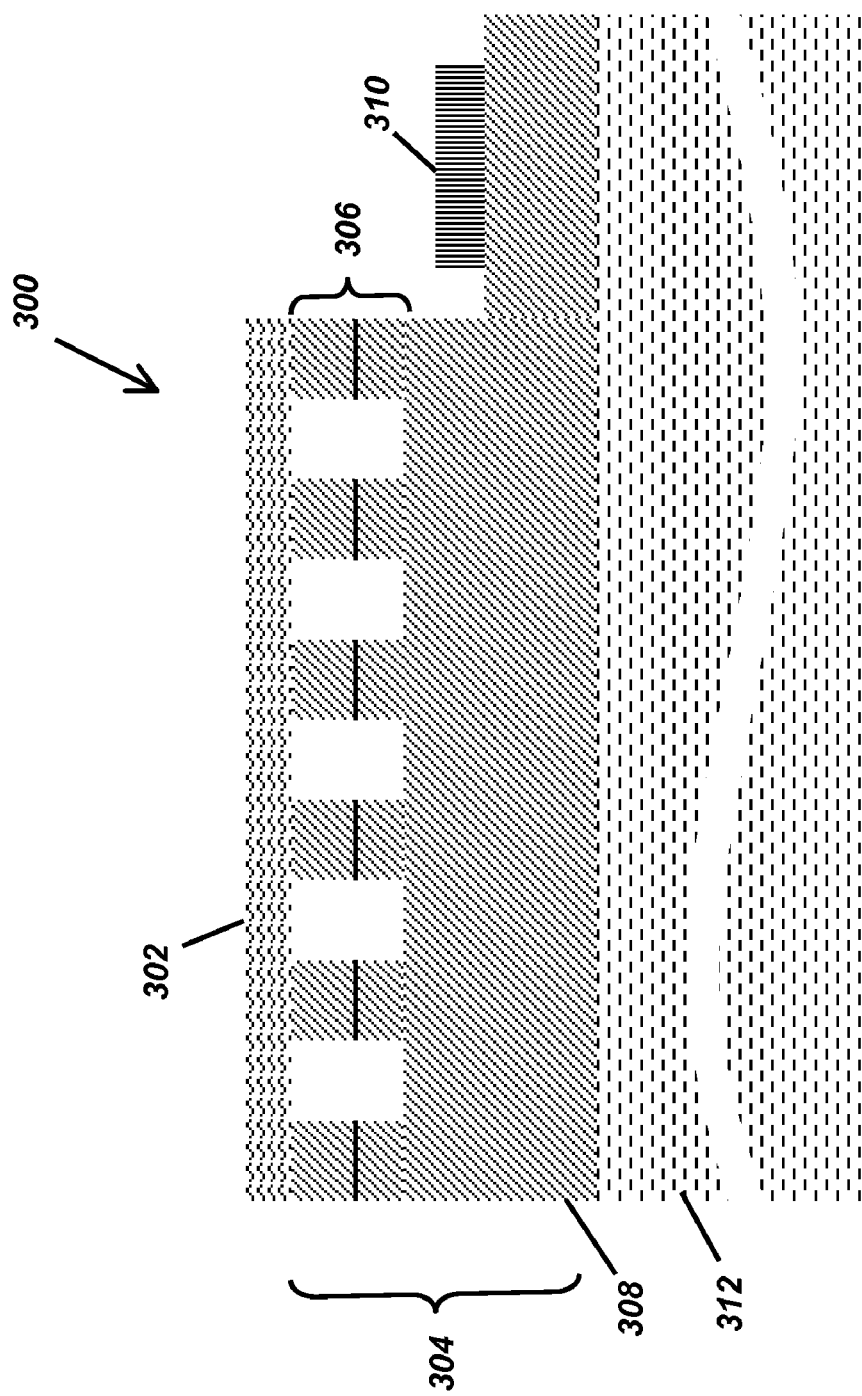
FIG. 3 is a schematic cross-section of an (Al, Ga, In)N LED comprising a top reflective electrode and a structured emitting region.

A variant of the FIG. 2 implementation is shown in FIG. 3. FIG. 3 is a schematic cross-section of an (Al, Ga, In)N LED 300 comprising a top reflective p contact electrode 302, an (Al,Ga,In)N layer 304 containing a structured emitting region/active layer 306 and a buffer layer 308, an n contact 310, and a substrate 312. The (Al, Ga, In)N LED 300 uses a top reflecting contact 302 for emission through the substrate 312.

Both the substrate 312, and first buffer layer 308 grown on the substrate 312, induce some loss. It can be useful to detach the (Al,In,Ga)N layer 304 from the substrate 312 using any substrate removal technique, for example, using laser lift off (LLO), dry etching or chemical etching, and then to thin down the buffer layer 308. Thus, in FIG. 3, light emission is directed downward (and the LED is typically mounted as a flip-chip LED).

Figure 4:
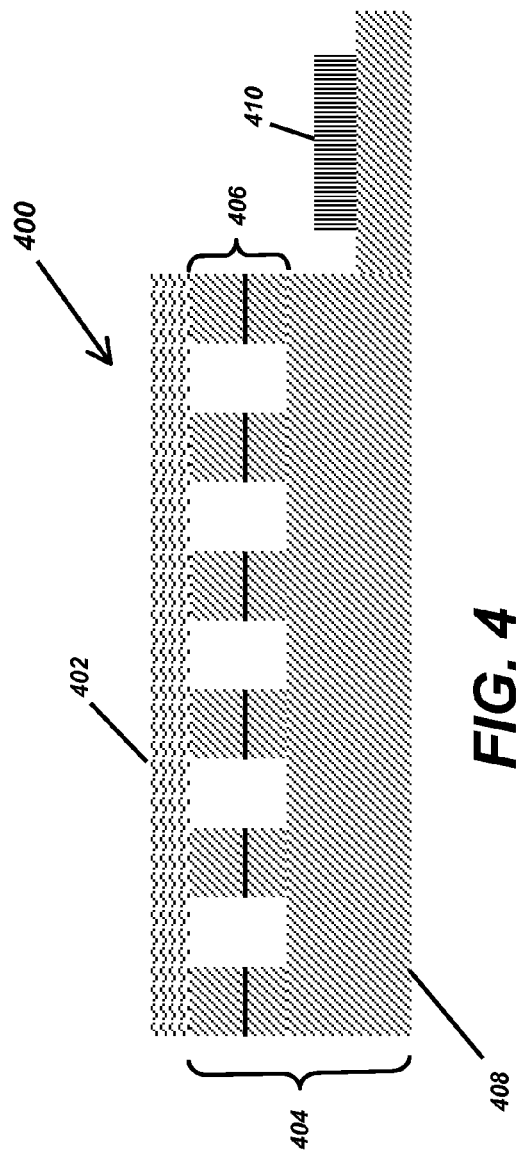
FIG. 4 is a schematic cross-section of an (Al, Ga, In)N LED comprising a top reflective electrode, a structured emitting region, and a bottom electrode which is a side electrode, where the substrate has been removed and the (Al, Ga, In)N region has been (optionally) thinned down.

FIG. 4 is a schematic cross-section of an (Al, Ga, In)N LED 400 comprising a top reflective p electrode 402, an (Al,Ga,In)N layer 404 containing a structured emitting region/active layer 406, a buffer layer 408, and a bottom n contact electrode 410 which is a side electrode, where the substrate has been removed and the (Al, Ga, In)N buffer region 408 has been (optionally) thinned down.

Figure 5:
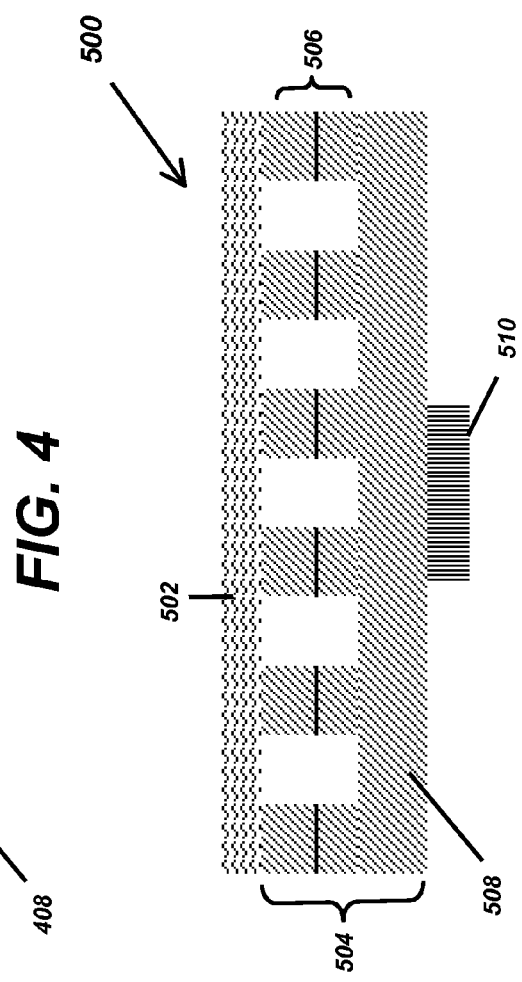
FIG. 5 is a schematic cross-section of an (Al, Ga, In)N LED comprising a top reflective electrode, a structured emitting region, and a bottom electrode placed at the bottom of the structure, where the substrate has been removed and the (Al, Ga, In)N region may optionally be thinned down.

FIG. 5 is a schematic cross-section of an (Al, Ga, In)N LED 500 comprising a top reflective p electrode 502, an (Al,Ga,In)N layer 504 containing a structured emitting region/active layer 506, a buffer layer 508, and a bottom n contact electrode 510 placed at the bottom of the structure, where the substrate has been removed and the (Al, Ga, In)N buffer region 508 may optionally be thinned down.

In view of the above, FIGS. 4 and 5 show finished structures 400 and 500 comprising the structured emitting region/active layer 406 and 506, a top reflective contact 402 and 502, and a side or bottom second contact 410 and 510, where the substrate has been removed. Thus, light emission is directed downward (and the LED is typically mounted as a flip-chip LED).

Figure 6:
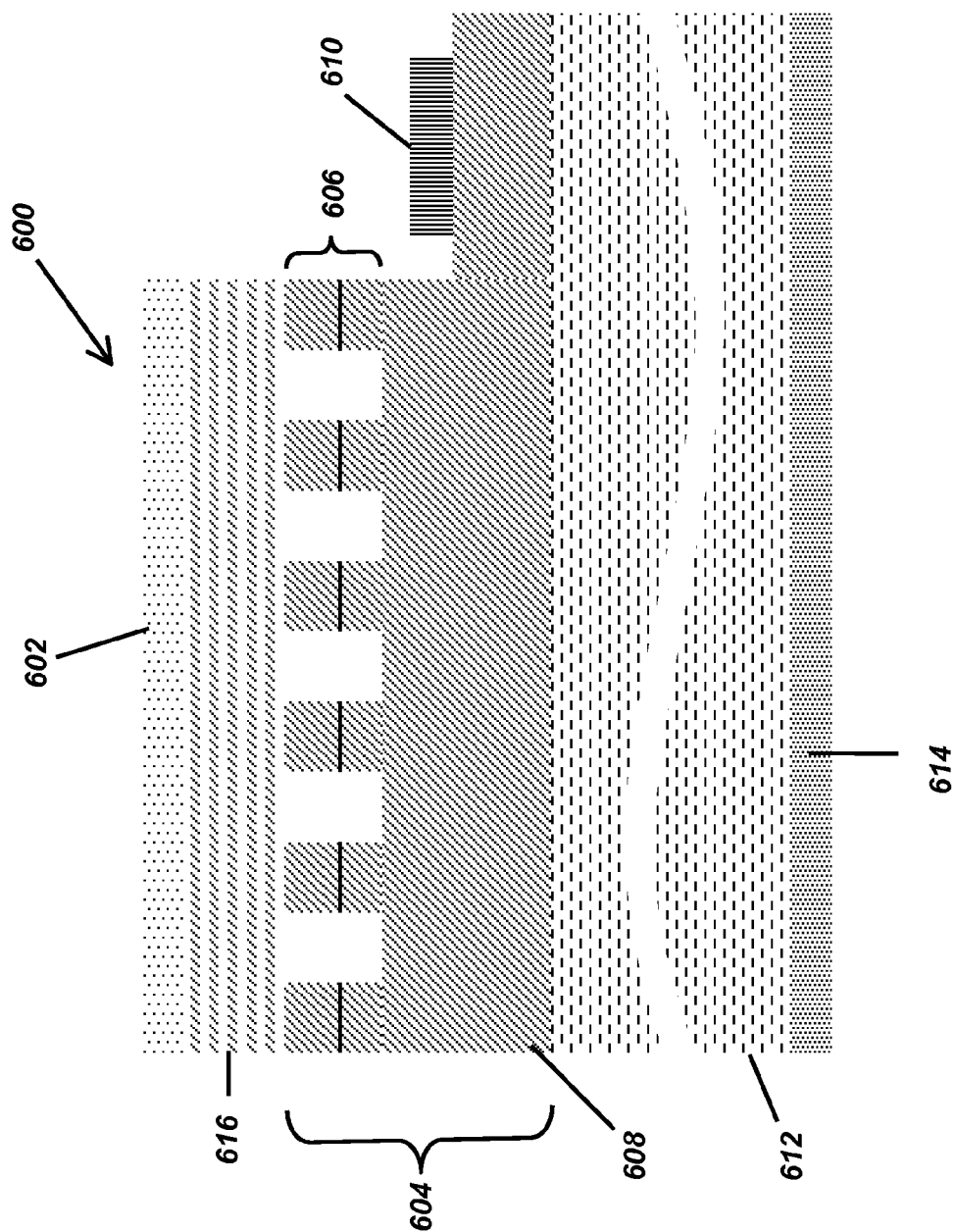
FIG. 6 is a schematic cross-section of an LED structure comprising an (Al, Ga, In)N layer, a top reflective electrode, a structured emitting region and a transparent top contact, where an intermediate GaN layer has been regrown over the structured region.

In order to improve optical and electrical performance further, it can be useful to grow a GaN layer on top of the structured emitting region/active layer, as illustrated in FIG. 6. In this regard, FIG. 6 is a schematic cross-section of an LED structure 600 comprising a transparent top p contact 602, an (Al, Ga, In)N layer 604 containing structured emitting region/active layer 606 and a buffer layer 608, an n contact 610, a substrate 612, an optional backside mirror 614, and an intermediate GaN layer 616 that has been regrown over the structured region 606.

Layer 616 can be grown during the same growth sequence as the structured emitting region/active layer(s) 606 of the device, by changing growth conditions from columnar growth to coalesced growth, once the structured emitting region/active layer 606 has been grown to a desired thickness. If the structured emitting region/active layer 606 is obtained by etching, then the contact GaN layer 616 is re-grown under conditions for coalescence in order to obturate the holes (e.g., from less than 100 nm to several microns). In other variants, light can be emitted upwards using a transparent top electrode 602 or up and down.

Figure 7:
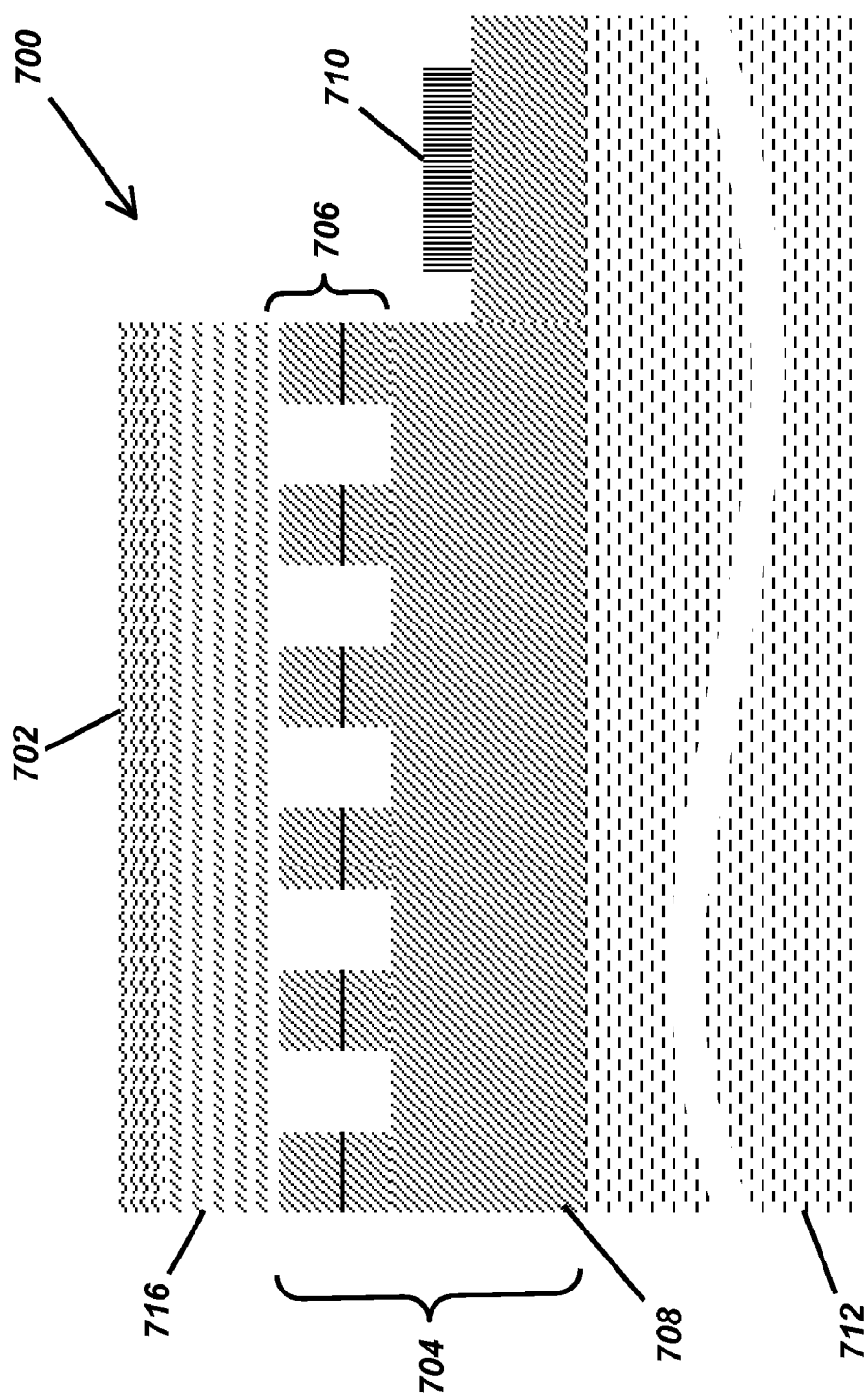
FIG. 7 is a schematic cross-section of an (Al, Ga, In)N LED comprising a top reflective electrode and a structured emitting region, where an intermediate GaN layer has been regrown over the structured region.

Similar to FIG. 6, FIG. 7 is a schematic cross-section of an (Al, Ga, In)N LED 700 comprising a top reflective p contact electrode 702, an (Al, Ga, In)N layer 704 containing a structured emitting region/active layer 706 and a buffer layer 708, a bottom n contact electrode 710, a substrate 712, and an intermediate GaN layer 716 that has been regrown over the structured emitting region/active layer 706 (e.g., from less than 100 nm to several microns). In the embodiment of FIG. 7, light can be emitted downwards using the reflective top electrode 702 (and the LED is typically mounted as a flip-chip LED).

Figure 8:
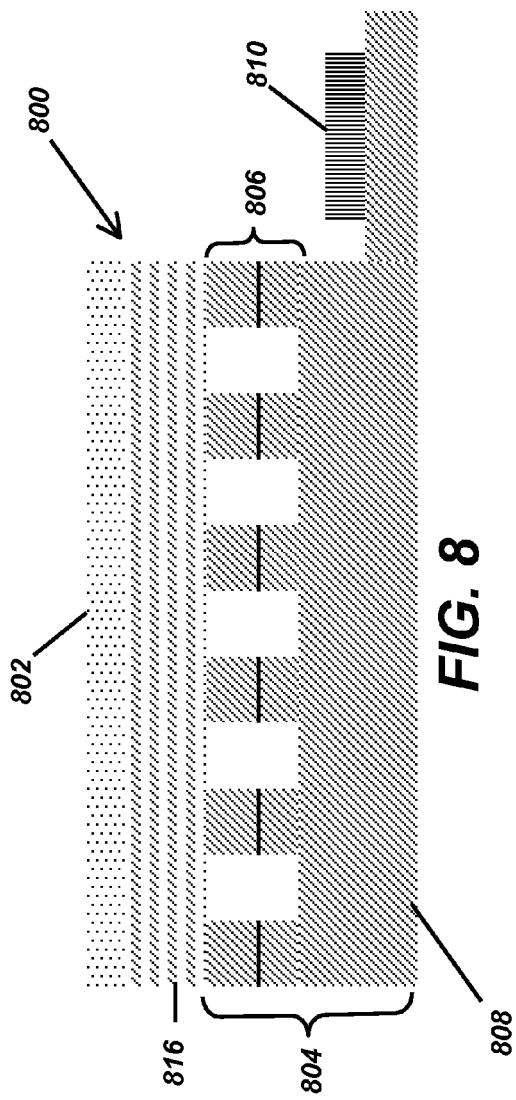
FIG. 8 is a schematic cross-section of an (Al, Ga, In)N LED comprising a top reflective or transparent electrode, a structured emitting region, and a bottom electrode positioned on the side of the structure, where an intermediate GaN layer has been regrown over the structured region, where the substrate has been removed and the (Al, Ga, In)N region may be optionally thinned down.

FIG. 8 is a schematic cross-section of an (Al, Ga, In)N LED 800 comprising a top reflective or transparent p contact electrode 802, an (Al, Ga, In)N layer 804 containing a structured emitting region/active layer 806 and buffer layer 808, and a bottom electrode 810 positioned on the side of the structure 804, where an intermediate GaN layer 816 has been regrown (e.g., from less than 100 nm to several microns) over the structured emitting region/active layer 806, where the substrate has been removed and the (Al, Ga, In)N buffer region 808 may be optionally thinned down.

Figure 9:
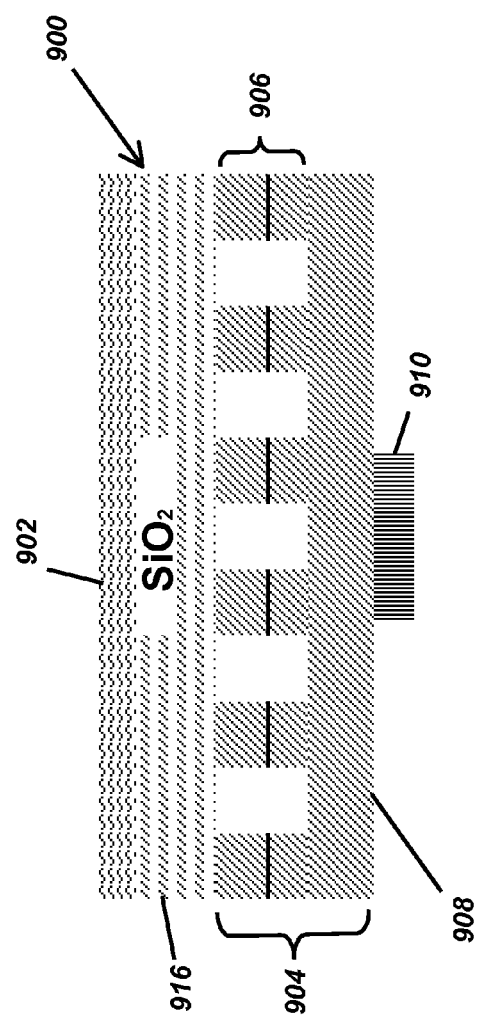
FIG. 9 is a schematic cross-section of an (Al, Ga, In)N LED comprising a top reflective or transparent electrode, a structured emitting region, and a bottom electrode placed at the bottom of the structure, where an intermediate GaN layer has been regrown over the structured region, the substrate has been removed, and the (Al, Ga, In)N region may optionally be thinned down.

Similarly, FIG. 9 is a schematic cross-section of an (Al, Ga, In)N LED 900 comprising a top reflective or transparent p contact electrode 902, an (Al, Ga, In)N layer 904 containing a structured emitting region/active layer 906 and buffer layer 908, and a bottom n contact electrode 910 placed at the bottom of the structure 904, where an intermediate GaN layer 916 has been regrown (e.g., from less than 100 nm to several microns) over the structured emitting region/active layer 906, the substrate has been removed, and the (Al, Ga, In)N buffer region 908 may optionally be thinned down. The purpose of the structured $SiO_2$ in the GaN layer 916 is to make a current aperture by having an insulating region under the p-type electrode 902 facing the n-type electrode 910, so that the hole current current from the p-side is injected sideways from the $SiO_2$, and the light emission from the structure will not be blocked by the n-type electrode 910, as it will occur sideways from it.

Consequently, device performance can be improved by removing the substrate and thinning the buffer layer 808 and 908, again with the two possibilities of top or bottom emission through the choice of top contact, for example, a transparent contact 802, as shown in FIG. 8, or reflecting contact 902, as shown in FIG. 9.

Figure 10:
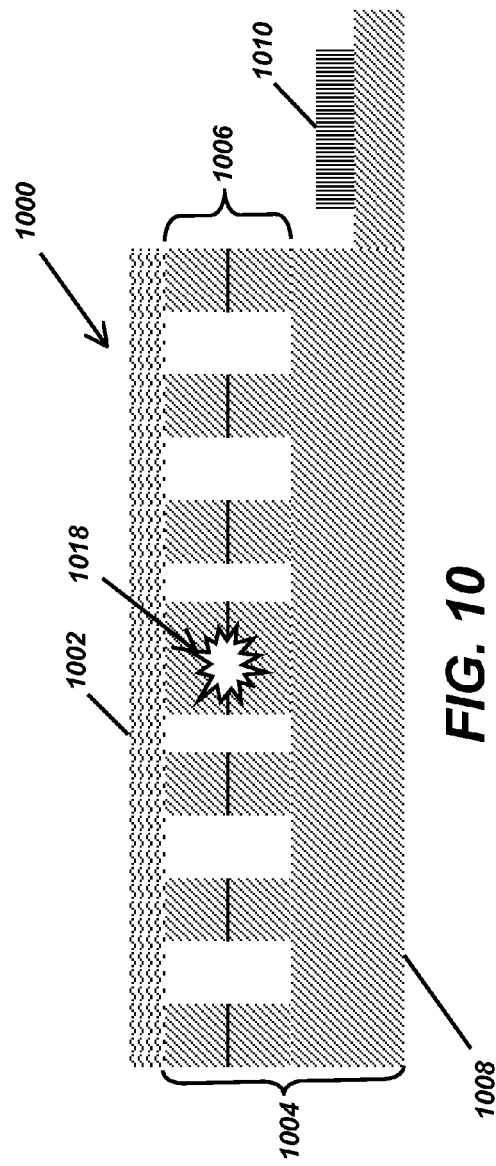
FIG. 10 is a schematic cross-section of an (Al, Ga, In)N LED comprising a top reflective or transparent electrode and a structured emitting region, where the substrate has been removed, the (Al, Ga, In)N region eventually thinned down, and the bottom electrode being placed at the side of the structure, and where the emitting region structuring is such that a strong localized optical mode occurs in some part of the structured emitting region.

FIG. 10 is a schematic cross-section of an (Al, Ga, In)N LED 1000 comprising a top reflective or transparent electrode p contact 1002, an (Al, Ga, In)N layer 1004 containing a structured emitting region/active layer 1006 and buffer layer 1008, where the substrate has been removed. The (Al, Ga, In)N buffer region 1008 may eventually be thinned down, and the bottom n contact electrode 1010 is placed at the side of the structure 1004. In addition, the structured emitting region/active layer 1006 contains a light emitting species 1018. Further, the structuring of region 1006 is such that a strong localized optical mode occurs in some part of the region 1006.

Figure 11:
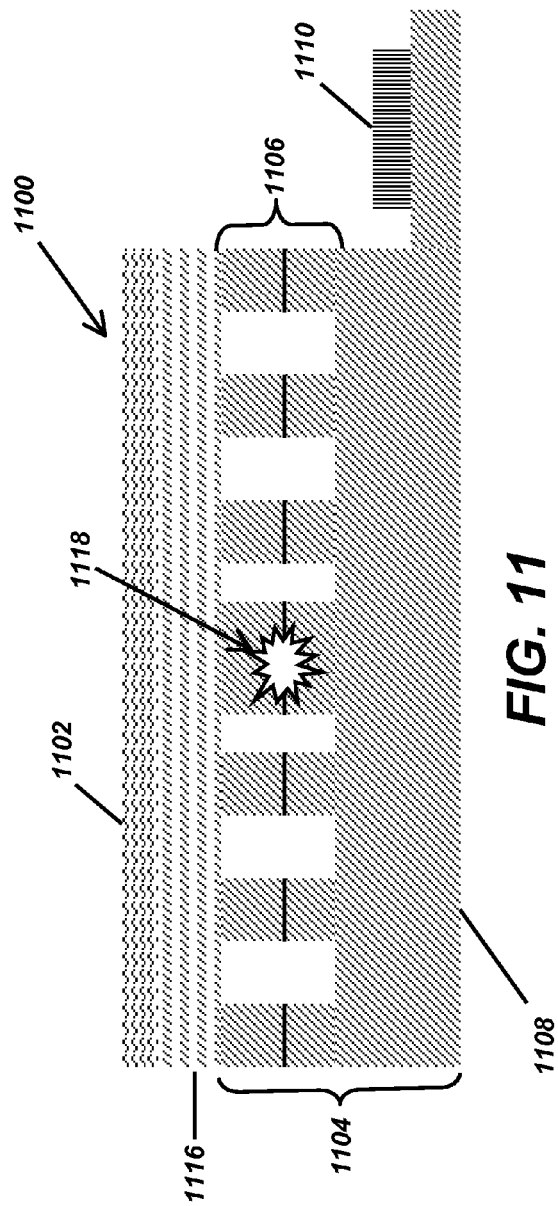
FIG. 11 is a schematic cross-section of an (Al, Ga, In)N LED comprising a top reflective or transparent electrode, a structured emitting region, and a bottom electrode placed at the side of the structure, where an intermediate GaN layer has been regrown over the structured region, the substrate has been removed, the (Al, Ga, In)N region may (optionally) be thinned down and the emitting region structuring is such that a strong localized optical mode occurs in some part of the structured emitting region.

FIG. 11 is a schematic cross-section of an (Al, Ga, In)N LED 1100 comprising a top reflective or transparent p contact electrode 1102, an (Al, Ga, In)N layer 1104 containing a structured emitting region/active layer 1106 and buffer layer 1108, a bottom n contact electrode 1110 placed at the side of the structure 1104, where an intermediate GaN layer 1116 has been regrown over the structured emitting region/active layer 1106, and the substrate has been removed. The (Al, Ga, In)N buffer region 1108 may (optionally) be thinned down. In addition, the structured emitting region/active layer 1106 contains a light emitting species 1118. Finally, the structuring of region 1106 is such that a strong localized optical mode occurs in some part of the region 11106.

The implementations of FIGS. 10 and 11 can lead to special devices, for example, using non-regular patterns for the structured emitting region/active layer 1006 and 1106. For example, a pillar with larger diameter (e.g., the middle pillar with the labeled light emitting species 1018 and 1118) could result in a strongly confined mode, thus leading to a large enhancement of the radiative recombination rate according to the Purcell effect. This can be implemented in the various devices described above, for example, in the thinned structures with or without a GaN contact layer 1116, as illustrated in FIGS. 10 and 11, respectively.

Possible Modifications

The conductive transparent electrodes can be shaped to increase light extraction. Alternatively, the whole structure may be placed in an environment such as epoxy, which also provides for increased light extraction. This environment may also be shaped for optimal light extraction. The environment can be doped with species absorbing LED light and re-emitting at longer wavelengths, thus providing white light emission.

A preferred transparent electrode comprises ZnO. However, the ZnO can be replaced by another material having similar characteristics, namely good transmission properties, high refractive index for efficient light extraction, and good electrical properties. Examples of materials comprise, for instance, silicon carbide (SiC) or indium tin oxide (ITO).

The contacts used here can be made by any technique, for example, epitaxy, bonding, or sputtering. Eventually, in the case of bonding, it can be advantageous to use an ultrathin metal layer to improve the electrical characteristics. The transparent contact can be situated on either side of the device when there is no substrate.

The active layers can be comprised of one or several quantum wells, or one or several layers of other emitting species such as quantum dots. The vertical position of the emitting species is optimized to obtain the maximum emission outside the structure.

Figure 12:
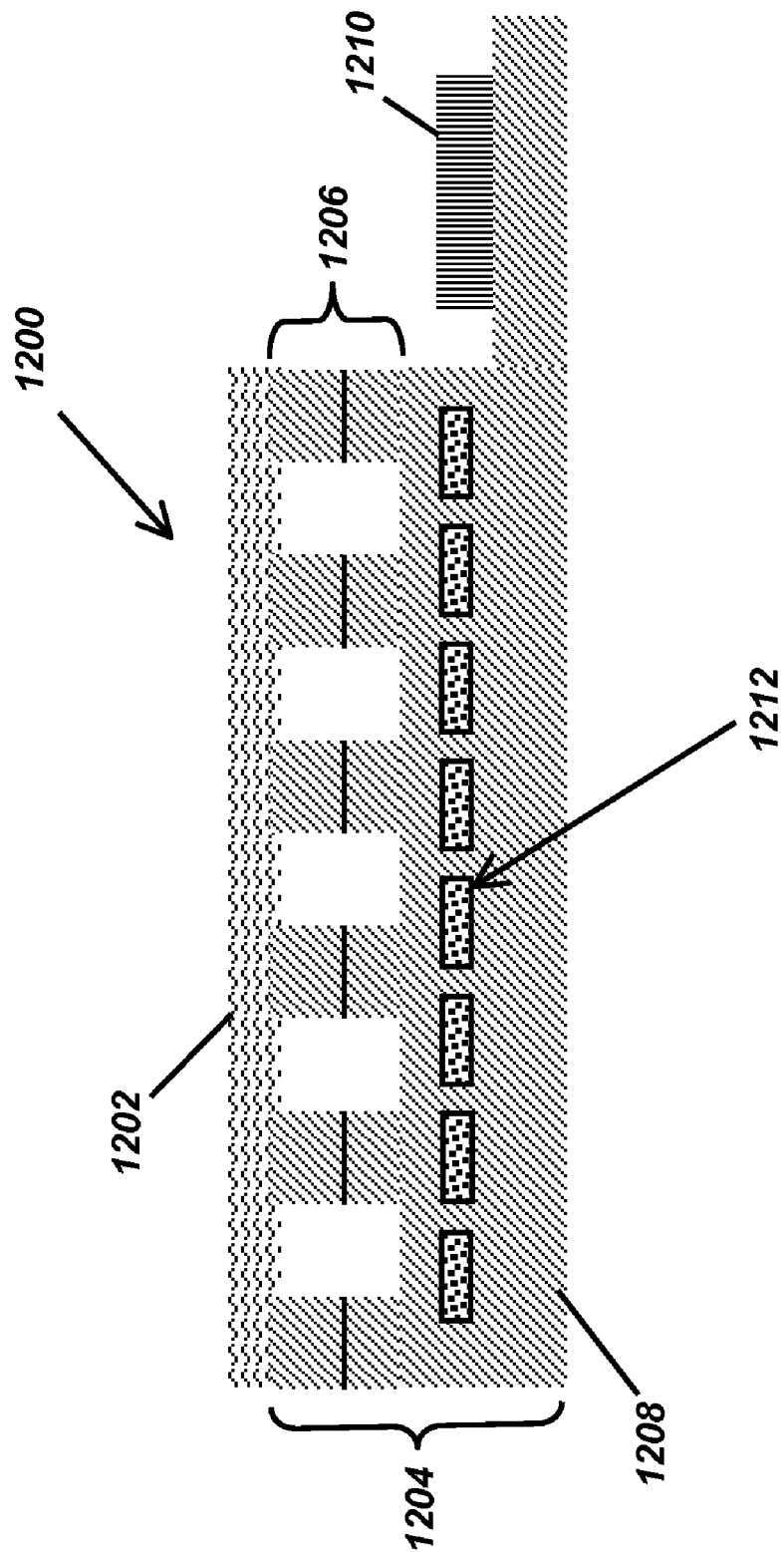
FIG. 12 is a schematic cross-section of an (Al, Ga, In)N and ZnO direct wafer-bonded LED structure, where the upper part of the (Al, Ga, In)N layer has been grown above randomly patterned regions.

FIG. 12 is a schematic cross-section of an (Al, Ga, In)N and ZnO direct wafer-bonded LED structure 1200 comprising a reflective (or transparent) p contact electrode 1202, an (Al, Ga, In)N layer 1204 containing a structured emitting region/active layer 1206 and buffer layer 1208, and a bottom n contact electrode 1210 placed at the side of the structure 1204. The upper part of the (Al, Ga, In)N layer 1204 has been grown above randomly intermediate patterned regions 1212. The structuring can be associated with other types of structuring, leading to improved properties. Thus, FIG. 12 shows the association of a structure 1200 according to the present invention with a lateral epitaxial overgrowth (LEO) grown structure, as described in U.S. Provisional Application Ser. Nos. 60/802,993 and 60/774,467; and U.S. Utility application Ser. Nos. 11/067,957 and 11/067,910; which applications are listed in the Cross-Reference section above.

The design of the pattern within patterned regions 1212 can be optimized in order to obtain directional emission, due to the peculiar emission properties of patterned structures. Also, one can use the properties of patterned structures to obtain low threshold lasers and lasing emission in given directions.

Figure 13:
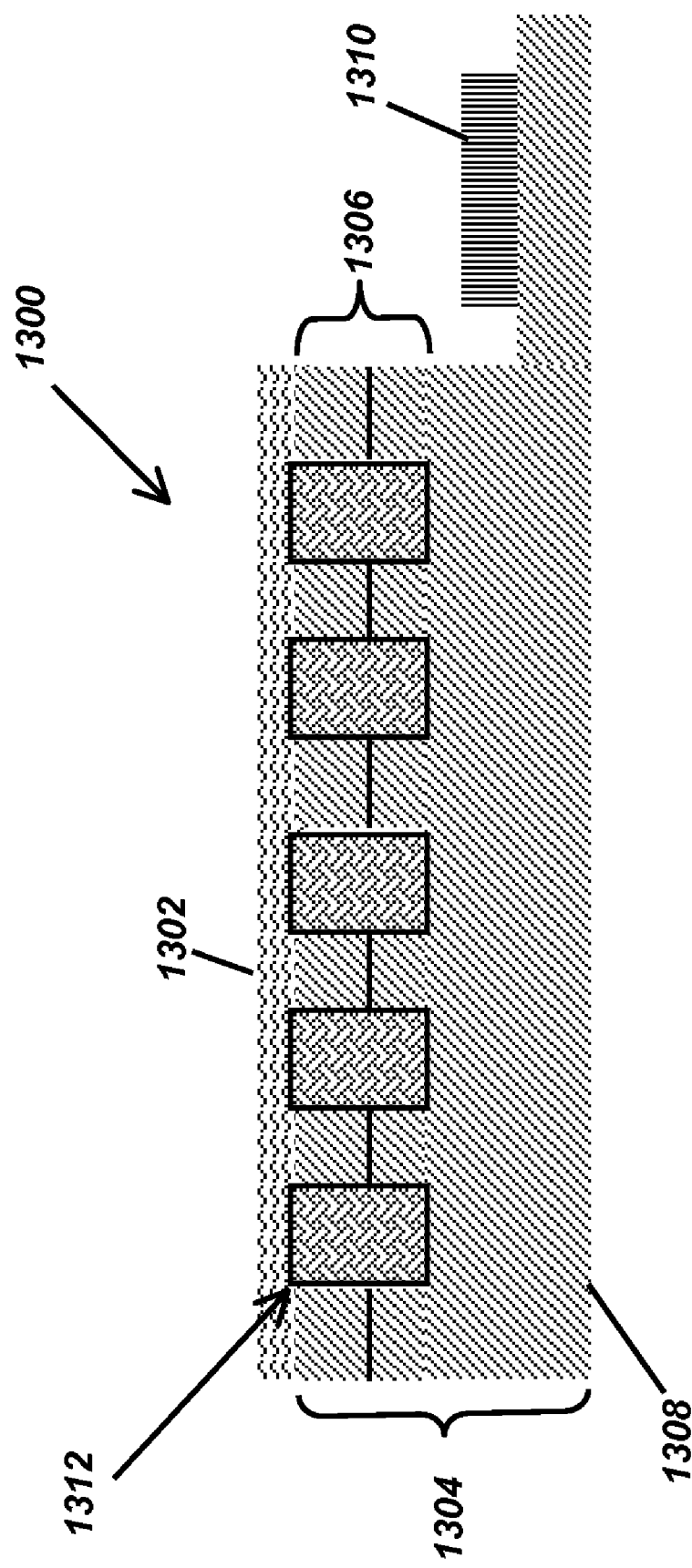
FIG. 13 is a schematic cross-section of an (Al, Ga, In)N LED structure comprising a structured emitting region, where the holes in the structured region have been filled with some material such as dielectric, metal, semiconductor or any other optically active material such as light emitting polymers or dyes.

FIG. 13 is a schematic cross-section of an (Al, Ga, In)N LED structure 1300 comprising a reflective (or transparent) p contact electrode 1302, an (Al, Ga, In)N layer 1304 containing a structured emitting region 1306 and buffer layer 1308, and a bottom n contact electrode 1310 placed at the side of the structure 1304. The holes 1312 in the structured region 1306 have been filled with some material such as dielectric, metal, semiconductor or any other optically active material such as light emitting polymers or dyes.

Thus, FIG. 13 shows how the holes 1312 in the structured region 1306 can be filled with materials selected to obtain other desired properties. For example, dielectrics can reinforce the structures, metals can enhance emission through plasmon effects or improve carrier injection, and emitting species such as dye impregnated polymers, light emitting polymers, phosphors and other similar species can be used to obtain overall white light emission.

The shape, size and other parameters can be varied. For example, the crystal parameters of a photonic crystal used in a second light extractor can be varied along the structure in order to provide position-dependent light extraction behaviour.

The typical parameter for the structuring, i.e., the photonic crystal lattice period if one uses periodic patterning, is chosen to satisfy the first order diffraction condition of about 100 nanometer (nm) period, or up to higher orders, such as a few hundred periods. Less ordered structures can also be used, such as Archimedean tilings or quasi-periodic structures, or even disordered structures.

The concepts described herein for (Al,Ga,In)N based materials can be used for other materials, such as other inorganic materials such as semiconductors, or organic materials such as light-emitting small molecules or polymers.

REFERENCES

The following publications are incorporated by reference herein:

[1] U.S. Pat. No. 6,538,371, issued Mar. 25, 2003, to Duggal et al., and entitled "White Light Illumination System."
[2] U.S. Pat. No. 6,525,464, issued Feb. 25, 2003, to Y-C. Chin, entitled "Stacked Light-Mixing LED."
[3] U.S. Pat. No. 6,504,180, issued Jan. 7, 2003, Heremans et al., and entitled "Method of Manufacturing Surface Textured High Efficiency Radiating Devices And Devices Obtained Therefrom."
[4] U.S. Pat. No. 6,163,038, issued Dec. 19, 2000 to Chen et al. and entitled "White Light Emitting Diode and Method of Manufacturing the Same."
[5] U.S. Pat. No. 5,779,924, issued Jul. 14, 1998, to Krames et al. and entitled "Ordered Interface Texturing For a Light Emitting Device."
[6] U.S. Pat. No. 5,362,977, issued Nov. 8, 1994, to Hunt et al. and entitled "Single Mirror Light Emitting Diodes with Enhanced Intensity."
[7] U.S. Pat. No. 5,226,053, issued Jul. 6, 1993, to Cho et al., and entitled "Light Emitting Diode."
[8] M. R. Krames et al., "High-power truncated-inverted-pyramid $(Al_xGa_{1-x})_{0.5}In_{0.5}P$/GaP light-emitting diodes exhibiting greater than 50% external quantum efficiency," Applied physics letters vol. 75, pp. 2365-2367, (1999).
[9] W. Schmid and J. R. Eberhard F., King R., Miller M., Joos M. and K. J. Ebeling, "45% Quantum Efficiency Light-Emitting-Diodes with Radial Outcoupling Taper," presented at SPIE, San Jose, Calif., (2000).
[10] I. Schnitzer et al., "30% External Quantum Efficiency from Surface Textured, Thin-Film Light-Emitting-Diodes," Applied Physics Letters vol. 63, pp. 2174-2176, (1993).
[11] T. Fujii et al., "Cone-shaped surface GaN-based light-emitting diodes," Physica Status Solidi C, no. 7, pp. 2836-40 (2005).
[12] Z. H. Feng and K. M Lau, "Enhanced luminescence from GaN-based blue LEDs grown on grooved sapphire substrates," IEEE Photonics Technology Letters, vol. 17, no. 9, pp. 1812-14 (September 2005).
[13] T. Gessmann et al., "Light-emitting diodes with integrated omnidirectionally reflective contacts," Proceedings of the SPIE, vol. 5366, no. 1, 2004, pp. 53-61.

[14] R. Windisch et al., "InGaAlP thin film LEDs with high luminous efficiency," Proceedings of the SPIE, vol. 5366, no. 1, pp. 43-52 (2004).

[15] Y. C. Shen et al., "Optical cavity effects in InGaN/GaN quantum-well-heterostructure flip-chip light-emitting diodes," Proceedings of the SPIE, vol. 5366, no. 1, pp. 20-25 (2004)

[16] R. Joray et al., "High efficiency planar MCLEDs," Physica Status Solidi B, vol. 242, pp. 2315-25, (2005)

[17] C. Weisbuch et al, "Recent results and latest views on microcavity LEDs," Proceedings of the SPIE, vol. 5366, no. 1, pp. 1-19 (2004)

[18] A. David et al., "Photonic crystal laser lift-off GaN light-emitting diodes," Applied Physics Letters, vol. 88, pp. 133514-1-3 (2006).

[19] R. Davis et al., "Pendeo-epitaxy—A new approach for lateral growth of gallium nitride films," MRS Internet Journal Nitride Research 6, p. 14, (2001).

[20] T. M. Katona, J. S. Speck and S. P. DenBaars, "Effect of the nucleation layer on stress during cantilever epitaxy of GaN on Si (111)," Physical Status Solidi A, 194, pp. 541-544, (2002).

[21] Isao Kidoguchi, Akihiko Ishibashi, Gaku Sugahara, and Yuzaburoh Ban, "Air-bridged lateral epitaxial overgrowth of GaN thin films," Applied Physics Letters 76, pp. 3768-3770 (2000).

[22] B. Beaumont, P. Vennegues, P. Gibart, "Epitaxial Lateral Overgrowth of GaN," Physica Status Solidi (b) 227, 1-43 (2001).

[23] Fujita et al., "Simultaneous Inhibition and Redistribution of Spontaneous Light Emission in Photonic Crystals," Science vol. 308, p. 1296, (2005).

[24] S. Keller, C. Schaake, N. A. Fichtenbaum, C. J. Neufeld, Y. Wu, K. McGroody, A. David, S. P. DenBaars, C. Weisbuch, J. S. Speck, and U. K. Mishra, "Optical and structural properties of GaN nanopillar and nanostripe arrays with embedded InGaN/GaN multi quantum wells," Journal of Applied Physics 100, 054314 (2006).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. A light emitting diode (LED), comprising:
a structured emitting region including one or more light emitting active layers embedded in a plurality of index modulation layers, wherein the index modulation layers are structured as a photonic crystal with the active layers embedded within the photonic crystal, the index modulation layers include a low index layer and a high index layer, the low index layer has a lower refractive index than the high index layer, and the active layer is positioned inside the lower index layer.

2. The LED of claim 1, wherein the LED has an emission rate 60% to 80% of an emission rate for a non structured emitting region comprised of the higher index layer.

3. The LED of claim 1, further comprising a p-type contact and an n-type contact for applying a bias across the contacts, wherein the p-type contact or the n-type contact is a transparent electrode on or above the structured emitting region.

4. The LED of claim 3, wherein the transparent electrode comprises zinc oxide, silicon carbide or indium tin oxide.

5. The LED of claim 1, further comprising a p-type contact and an n-type contact for applying a bias across the contacts, wherein the p-type contact or the n-type contact is a reflective contact on or above the structured emitting region.

6. The LED of claim 1, wherein the structured emitting region comprises (Al,Ga,In)N.

7. The LED of claim 1, further comprising a backside mirror positioned on a surface of the LED.

8. The LED of claim 1, further comprising a regrown GaN layer between the structured emitting region and the p-type contact or the n-type contact for improving electrical contact, optical properties or both.

9. The LED of claim 1, further comprising a structured lateral epitaxial grown region below or on top of the structured emitting region.

10. The LED of claim 1, further comprising one or more materials filling holes in the photonic crystal, wherein the materials filling the holes are dielectric, metal, semiconductor, or optically active materials.

11. The LED of claim 10, wherein the optically active materials are light emitting polymers dyes, dye impregnated polymers, phosphors, or species used to obtain overall white light emission from the LED.

12. The LED of claim 1, wherein the photonic crystal has a non-regular pattern.

13. The LED of claim 1, wherein the photonic crystal has a periodic pattern.

14. The LED of claim 1, wherein the photonic crystal has a pattern optimised for directional light emission.

15. A method for fabricating a light emitting diode (LED) having efficient light extraction, comprising
forming a structured emitting region including one or more light emitting active layers embedded in a plurality of index modulation layers, wherein the index modulation layers are structured as a photonic crystal with the active layers embedded within the photonic crystal, the index modulation layers include a low index layer and a high index layer, and the low index layer has a lower refractive index than the high index layer, and the active layer is positioned inside the lower index layer.

16. The method of claim 15, wherein the structured emitting region is formed by etching or direct organized growth.

17. The method of claim 15, further comprising forming a reflective contact on top of the structured emitting region.

18. The method of claim 15, further comprising forming a transparent contact by direct deposition or attachment of a thin conductive and transparent layer on top of the structured emitting region.

19. The method of claim 15, further comprising removing the LED from a substrate.

20. The method of claim 15, further comprising thinning the structured emitting region.

21. The method of claim 15, further comprising growing or regrowing GaN on top of the structured emitting region.

22. The method of claim 15, further comprising growing an additional lateral epitaxial overgrowth (LEO) grown structured layer below or on top of the structured emitting region.

23. The method of claim 15, wherein the structured emitting region provides for light extraction from thin films, such as the photonic crystal acting as a diffraction grating.

24. The method of claim 15, wherein the structured emitting region controls in-plane emissions and allows new modes into which light will be emitted.

25. The LED of claim 1, wherein the light emitting active layers and index modulation layers are (Al,In,Ga)N layers.

26. The method of claim 15, wherein the light emitting active layers and index modulation layers are (Al,In,Ga)N layers.

* * * * *